United States Patent [19]

Flanigan et al.

[11] Patent Number: 4,582,581
[45] Date of Patent: Apr. 15, 1986

[54] BORON TRIFLUORIDE SYSTEM FOR PLASMA ETCHING OF SILICON DIOXIDE

[75] Inventors: Marie C. Flanigan, Lockport; Stephen M. Bobbio, Hamburg; Robert F. Aycock, Clarence; Ralph L. DePrenda, Amherst; Kenneth M. Thrun, Buffalo, all of N.Y.

[73] Assignee: Allied Corporation, Morris Township, Morris County, N.J.

[21] Appl. No.: 731,819

[22] Filed: May 9, 1985

[51] Int. Cl.$^4$ .................. C03C 15/00; C23C 15/00
[52] U.S. Cl. .................. 204/192 E; 156/643; 156/646; 156/657; 156/662; 204/192 EC; 252/79.1; 252/372
[58] Field of Search .............. 204/192 E, 192 EC; 156/643, 646, 657, 662; 252/79.1, 79.3, 79.4, 372; 423/292, 293

[56] References Cited

U.S. PATENT DOCUMENTS

| | | | |
|---|---|---|---|
| 3,246,949 | 4/1966 | Olstowski | 423/293 |
| 3,679,502 | 7/1972 | Hays | 136/17 |
| 3,880,684 | 4/1975 | Abe | 156/8 |
| 3,923,568 | 12/1975 | Bersin | 156/8 |
| 3,940,506 | 2/1976 | Heinecke | 427/38 |
| 3,971,684 | 7/1976 | Muto | 156/13 |
| 3,994,793 | 11/1976 | Harvilchuck et al. | 204/192 |
| 4,017,548 | 4/1977 | Petrille | 423/293 X |
| 4,026,742 | 5/1977 | Fujino | 156/643 |
| 4,052,251 | 10/1977 | Weitzel | 156/612 |
| 4,069,096 | 1/1978 | Reinberg et al. | 156/643 |
| 4,094,732 | 6/1978 | Reinberg | 156/643 |
| 4,214,946 | 7/1980 | Forget et al. | 156/643 |
| 4,263,467 | 4/1981 | Madgavkar et al. | 423/293 X |
| 4,283,249 | 9/1981 | Ephrath | 156/643 |
| 4,310,380 | 1/1982 | Flamm et al. | 156/643 |
| 4,314,875 | 2/1982 | Flamm | 156/643 |
| 4,324,611 | 4/1982 | Vogel et al. | 156/643 |
| 4,330,384 | 5/1982 | Okudaira et al. | 204/192 |
| 4,364,793 | 12/1982 | Graves | 156/643 |
| 4,381,967 | 5/1983 | Sanders et al. | 156/643 |
| 4,405,406 | 10/1983 | Casey et al. | 156/643 |
| 4,442,338 | 4/1984 | Yamazaki | 204/192 E X |
| 4,450,042 | 5/1984 | Purdes | 294/192 E X |
| 4,465,552 | 9/1984 | Bobbio et al. | 156/643 |
| 4,473,435 | 10/1984 | Zafiropoulo et al. | 156/643 |
| 4,479,850 | 10/1984 | Beinvogl et al. | 204/192 E X |

FOREIGN PATENT DOCUMENTS 137636  10/1981  Japan ................... 156/643

*Primary Examiner*—John F. Niebling
*Assistant Examiner*—Nam X. Nguyen
*Attorney, Agent, or Firm*—Arthur J. Plantamura; Jay P. Friedenson

[57] ABSTRACT

BF$_3$ based mixtures for selectively etching thin layers of silicon dioxide over silicon for use in the plasma etch process for integrated circuits manufacture is disclosed.

In the process, when trace amounts of formaldehyde are added to the etch system the rate on oxide inceases markedly. The effect on the silicon is not substantial. The optional addition of an inert diluent gas did not substantially change these results.

7 Claims, 4 Drawing Figures

BORON TRIFLUORIDE SYSTEM FOR PLASMA ETCHING OF SILICON DIOXIDE

DESCRIPTION

BACKGROUND OF THE INVENTION

This invention relates to plasma or reactive ion etch processes for preferentially etching silicon dioxide over silicon in integrated circuit manufacture. Specifically it relates to the use of a plasma etch gas incorporating $BF_3$ and, preferably, $BF_3$ in combination with a formaldehyde species for selectively etching thin layers of silicon dioxide over silicon.

An important step in the manufacture of semiconductor chips and thin film circuitry is the etching of the different layers such as polysilicon and silicon dioxide which make up the finished semiconductor chip or the thin film circuit. In the manufacture of these thin film circuits, one method of etching has been to overlay the surface to be etched with a suitable mask and to immerse the circuit so masked in a chemical solution which attacks the surface to be etched while leaving the mask otherwise intact. It has been difficult with the chemical etching processes presently known to achieve well-defined edges on the etched surfaces. The difficulty arises because the chemical action tends to etch isotropically, i.e., it undercuts the mask by the same distance that it penetrates the underlayer, and thus enlarges the feature. It is, therefore, very difficult to use wet chemical etching to achieve fine structures; fine structures being defined as structures having geometries on the order of one micron.

One known method for manufacturing semiconductor chips is called "plasma etching" in which a vacuum chamber containing an excited and a grounded electrode is filled with a gas such as a fluorocarbon or $SF_6$ at low pressure. The electric field established between the electrodes serves to dissociate the gas forming a plasma capable of etching a $SiO_2$ surface.

The ability to etch thin (approximately 1μ) layers of $SiO_2$ over Si is an important aspect of the plasma etch processes used in microcircuit manufacture. The plasma field of any given apparatus or oxide layer thickness is not necessarily uniform over the entire wafer surface, thus the etch may penetrate the $SiO_2$ layer at different times. In order to avoid etching the underlying silicon underlayer where the oxide has first cleared, it is desirable to arrange a selective plasma process which does not seriously affect or diminish the etch rate on $SiO_2$ but significantly decreases the rate on silicon.

Plasma etching wherein various plasma generating compositions, such as $CF_4$, $CHF_3$, $C_2F_6$, $C_2F_4$, $CCl_4$, $BCl_3$, etc., including admixtures, with $O_2$, $N_2$, Ar or air, are contained in a reactor under a specific pressure are known in the prior art. The material to be etched is introduced into the reactor and the etching process is effected by radicals formed by the plasma. In the past, such compositions have not yielded consistently satisfactory results. It would accordingly be desirable to have a plasma gas composition which when used with low frequency electrical excitation would produce selective etching of thin layers of silicon dioxide over silicon.

The present invention utilizes a $BF_3$ based composition in plasma etching of silicon dioxide preferentially over silicon or polysilicon and while the prior art describes the use of $BF_3$ among other gases that may be used in an ion etching process, as disclosed in Japanese Patent Publication No. 137,636 of Oct. 27, 1981, no prior art is known which discloses the unique advantages of $BF_3$ plasma compositions in the selective etching of silicon dioxide over silicon or polysilicon.

SUMMARY OF THE INVENTION

In accordance with the invention, we have discovered that $BF_3$ plasma gas mixtures when used with low frequency electrical excitation demonstrate selective etching of thin layers of silicon dioxide over silicon and provides a very effective $SiO_2$ etchant for use in a plasma etch processes. The plasma gas may comprise $BF_3$ per se or the use of $BF_3$ with an inert diluent gas such as argon, helium, neon, krypton or xenon, etc. as the etch composition. Preferably, the $BF_3$ plasma etch composition is modified to contain a formaldehyde species therein. For example, the formaldehyde may be introduced by contacting the plasma gas with a condensed phase material which contains and supplies formaldehyde such as by contacting the gas with a paraformaldehyde resin.

We have discovered, in accordance with the invention, that by adding the formaldehyde component to the $BF_3$ plasma the relative etch rates on the silicon dioxide and silicon distinctly favor the silicon dioxide. Any deposition in the reactor or on the wafer encountered during the course of the etching operation is readily obviated by heating the environment contiguous to the plasma etching apparatus. The addition of a diluent gas to the $BF_3$ gas mixture did not substantially diminish the preferential etching of silicon dioxide over silicon.

DESCRIPTION OF THE PREFERRED EMBODIMENTS

Figure 1:
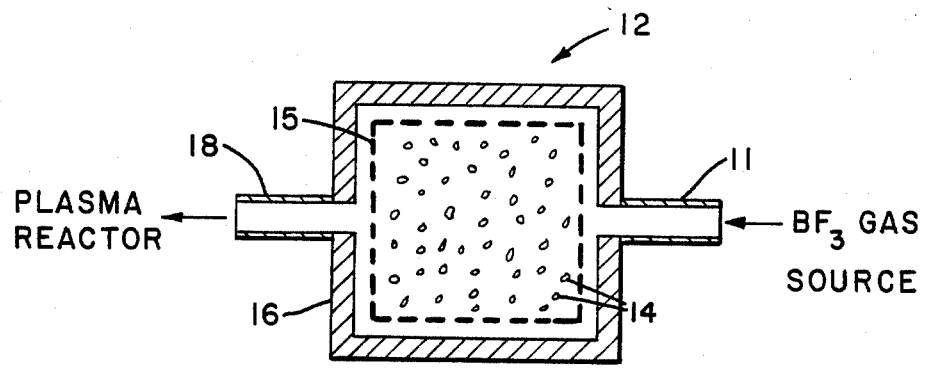
FIG. 1 illustrates one means of contacting a $BF_3$ plasma source gas stream with a source of formaldehyde

In accordance with the preferred embodiment, the present invention provides an improved composition for etching thin film circuits or semiconductor chips and is capable of producing well defined edges on etched materials while at the same time achieving rapid etching rates. The method permits the preferential etching of silicon dioxide over silicon or polysilicon in articles containing a layer of silicon dioxide on an underlayer of silicon or polysilicon in the manufacturing process. Specifically, the selective etching is effected by exposing the article to a plasma gas discharge wherein the plasma composition comprises $BF_3$. $BF_3$ alone may be employed but, preferably $BF_3$ is used in combination with a formaldehyde component, i.e., a substance which furnishes a $CH_2O$ additive to the $BF_3$ gaseous phase. It has been found that the addition of even a trace amount of formaldehyde to the $BF_3$ plasma gas composition enhances the etch rate on the silicon dioxide while the effect on silicon per se is not substantial.

In the etching process, the $BF_3$ composition is placed in a container along with the exciting electrode and a grounded electrode. The silicon dioxide surface to be etched is covered by a suitable mask and the substrate mounted on one of the electrodes, e.g., on the powered electrode, which may become negatively biased relative to ground once the plasma is established (reactive ion mode) or on the grounded electrode in the plasma mode. The electric field established in the region between the electrodes accelerates free electrons which then serve to dissociate the gas forming plasma which is positive relative to its surroundings. The silicon dioxide surface is etched by both chemical interaction with various active species and by energy and momentum transfer of positive ions impinging on the surface. The ions impinging on the silicon dioxide surface arrive predominantly in a direction perpendicular to that surface so that the process produces well defined vertically etched sidewalls.

When used in a parallel plate aluminum plasma reactor with 35 khz excitation, we have discovered that $BF_3$ is an effective selective etchant for $SiO_2$ over a silicon substrate. The oxide etch rate while not large is effective. Typical values of 500° A/min rate with $SiO_2/Si$ selectively of 2:1 were observed. It has been further discovered, however, that when trace amounts of formaldehyde $CH_2O$ are added to the etch system the rate on oxide increases markedly to, in some cases, as high as 4000° A/min. The effect on the silicon rate was less. Some increase was observed but at times the rate decreased slightly. Selectiveness as high as 14:1 in favor of silicon dioxide have been obtained.

In introducing the formaldehyde source into the system, reasonable control of the formaldehyde is required. While any practical means of introducing the formaldehyde into the plasma gas may be employed, we have found that such introduction may be conveniently effected by contacting the $BF_3$ gas with a resin which supplies the formaldehyde. This may be effected, for example, by passing the gas over a resin or polymeric composition having the paraformaldehyde structure:

$$[-OCH_2-_n]$$

In the formula the value of "n" varies from about 8 to about 100 although it may be higher.

The effect of the formaldehyde was discovered when an acetal thermoplastic homopolymer resin $(CH_2O)_n$, was exposed to $BF_3$ plasma. Thereafter, the cause of the increased oxide etch rate was identified as attributable to a source of formaldehyde. This was verified by the addition of a quantity of paraformaldehyde, in the $BF_3$ source gas stream as shown in FIG. 1 of the drawing. Alternately, in lieu of formaldehyde the second gas may contain molecules made up of carbon, hydrogen and oxygen so as to perform the same function as the formaldehyde in the plasma.

In the $BF_3$ plasma composition of the invention the protective mechanism of the silicon is the same regardless of the presence of the formaldehyde. XPS (X-ray photoelectron spectroscopy) spectra of the silicon surface are shown below:

TABLE A

| Element | Si($BF_3$ only) | Si($BF_3$ + $CH_2O$ species) |
|---|---|---|
| F | 7.4% | 7.3% |
| O | 14.8% | 12.5% |
| N | 2.6% | 1.8% |
| C | 18.3% | 17.4% |
| B | 45.2% | 48.1% |

TABLE A-continued

| Element | Si($BF_3$ only) | Si($BF_3$ + $CH_2O$ species) |
|---|---|---|
| Si | 11.6% | 12.9% |

The silicon etch rates were approximately the same for both surfaces. The elements C, N, and O appear as normal contaminants which are introduced during the transfer of the sample between the plasma and XPS instruments. The protection is clearly due to the formation of a silicon boride on the surface.

Oxide surfaces were similarly exposed with the XPS results shown below in Table B.

TABLE B

| Element | $SiO_2$($BF_3$ only) | $SiO_2$($BF_3$ + $CH_2O$ species) |
|---|---|---|
| F | 6.7% | 4.0% |
| O | 50.5% | 54.7% |
| N | .8% | .8% |
| C | 12.1% | 10.2% |
| B | 2.6% | 2.6% |
| Si | 27.2% | 27.6% |

In this case, the etch rates of the oxide exposed to the combination was much higher than that which was exposed to the pure $BF_3$ plasma. No significant amount of boron is seen on either surface. Whatever radical species is responsible for the increased oxide etch rate accomplishes its task and leaves without a trace.

In the drawing the mechanism for the introduction of the formaldehyde is illustrated by reference to FIG. 1 wherein $BF_3$ gas is shown entering at 11 into the chamber 12 which contains a source of formaldehyde e.g. paraformaldehyde 14 in the forms of solid granules or power. The source of formaldehyde 14 is contained within a permeable filter, e.g., 0.2$\mu$ filter such as polytetrafluoroethylene fabric 15 within a suitable container such as stainless steel container 16. The treated gas is withdrawn at 18 and is fed to the plasma reactor (not shown).

Figure 2:
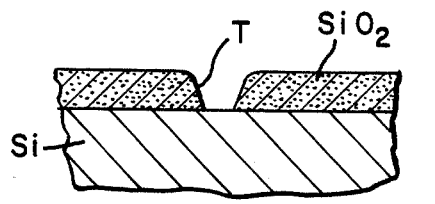
FIG. 2 illustrates a tapered profile etch of silicon dioxide on a silicon substrate
Figure 3:
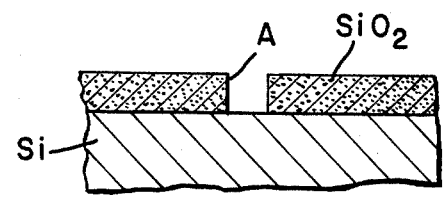
FIG. 3 illustrates an anisotropic profile of silicon dioxide on a silicon substrate and FIG. 4 illustrates metal flow and thickness variations of an aluminum coating on an anisotropically etched silicon dioxide layer on a silicon section.

When the oxide rate is large there is some evidence which shows a significant erosion of the oxide at the top edge of the side walls of the etched profile. This behavior is unusual in an oxide plasma or RIE process and might well lead to a tapered profile in the etch of the final geometry. This is shown in the sketch of the cross sections illustrated in FIGS. 2 and 3 wherein the tapered profile is illustrated at "T" in FIG. 2 and the anisotropic profile as "A" shown for comparison in FIG. 3.

Figure 4:
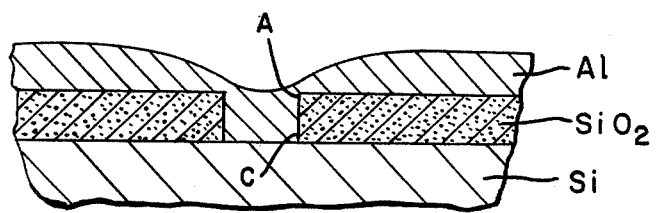

The ability to taper the oxide profile is generally important because it helps to assure the success of subsequent metallization steps in which aluminum is deposited over the oxide to contact the silicon substrate. If the oxide profile is not tapered, it becomes difficult to fill the lower corners C with the conducting metal in FIG. 4 of the drawing. This can cause conductivity problems which, in the worst cases, can lead to open circuits in the completed device.

Argon or other inert diluent gas such as helium, etc. may be added to the plasma mixture and without substantially changing the advantageous preferential etching of the $SiO_2$ over the silicon or polysilicon underlayer.

Any deposition of decomposition products tending to occur during the course of the etching process, as is often encountered with fluorocarbon processes should be avoided and may be eliminated by heating the reaction chamber, such as by wrapping a heating jacket or thermal tape around the plasma reactor. A minimum temperature of about 50° C. may be used. (This minimum temperature will vary somewhat depending on actual gas composition and power level used and other prevailing conditions.) The maximum temperature is limited by the photoresist mask and a temperature of 125° C. or below is usually necessary to avoid photoresist degradation.

While the invention has been particularly shown and described with reference to the preferred embodiments thereof, it will be understood by those skilled in the art that various changes in form and detail may be made therein without departing from the spirit and scope of the invention.

What is claimed is:

1. A method of selectively etching silicon dioxide preferentially over silicon or polysilicon in an article containing a layer of silicon dioxide on an underlayer of silicon or polysilicon which comprises exposing said article to a plasma gas mixture discharge wherein the plasma comprises $BF_3$ and formaldehyde gas wherein the formaldehyde is derived by contacting the plasma gas with a source of formaldehyde and continuing said exposure until the silicon dioxide layer is penetrated.

2. The method of claim 1 wherein the source of formaldehyde is introduced into the plasma gas from a polymeric composition containing the $-OCH_2-_n$ linkage wherein n has a value of from about 8 to 100.

3. The method of claim 1 wherein the source of formaldehyde is paraformaldehyde.

4. The method of claim 1 in which the gas mixture is diluted with an inert gas.

5. The methods any of claims 1, 2 or 3 where one of the aims of the oxide etch is to achieve a tapered profile.

6. A plasma etch gas for selectively etching silicon dioxide against silicon comprising $BF_3$ and formaldehyde where in the $BF_3$ gas is preconditioned by contacting said gas with a source of formaldehyde.

7. The plasma etch gas of claim 6 wherein the source of formaldehyde is paraformaldehyde.

* * * * *